(12) United States Patent
Miwa

(10) Patent No.: US 7,269,092 B1
(45) Date of Patent: Sep. 11, 2007

(54) CIRCUITRY AND DEVICE FOR GENERATING AND ADJUSTING SELECTED WORD LINE VOLTAGE

(75) Inventor: Toru Miwa, Kanagawa (JP)

(73) Assignee: SanDisk Corporation, Milpitas, CA (US)

( * ) Notice: Subject to any disclaimer, the term of this patent is extended or adjusted under 35 U.S.C. 154(b) by 0 days.

(21) Appl. No.: 11/409,164

(22) Filed: Apr. 21, 2006

(51) Int. Cl.
*G11C 8/00* (2006.01)
(52) U.S. Cl. .................. 365/230.06; 365/189.09; 365/226
(58) Field of Classification Search ........... 365/230.06, 365/226, 189.09, 189.11; 327/539, 540, 327/530
See application file for complete search history.

(56) References Cited

U.S. PATENT DOCUMENTS

| 5,319,370 | A  | * | 6/1994  | Signore et al. ............. 341/120 |
| 5,864,504 | A  |   | 1/1999  | Tanzawa et al. |
| 6,452,437 | B1 |   | 9/2002  | Takeuchi et al. |
| 6,809,575 | B2 | * | 10/2004 | Oddone et al. ............. 327/539 |
| 6,898,131 | B2 | * | 5/2005  | Marotta et al. ........ 365/189.09 |
| 2002/0109539 | A1 | | 8/2002 | Taeuchi et al. |

* cited by examiner

*Primary Examiner*—Gene N. Auduong
(74) *Attorney, Agent, or Firm*—Winston & Strawn LLP

(57) ABSTRACT

A memory device is provided that includes a memory array with memory cells and a row decoder connected to the memory array. The row decoder is configured to select a word line connected to the memory cells. Additionally included is a word line voltage generator that is configured to generate a selected word line voltage based on a difference between a constant voltage that is substantially independent of a temperature change and a voltage that varies in proportion to an absolute temperature, where an absence of the voltage that varies in proportion to the absolute temperature corresponds to the absolute temperature of absolute zero.

14 Claims, 12 Drawing Sheets

CIRCUITRY AND DEVICE FOR GENERATING AND ADJUSTING SELECTED WORD LINE VOLTAGE

CROSS-REFERENCES TO RELATED APPLICATIONS

This application is related to U.S. patent application Ser. No. 11/408,545, filed on Apr. 21, 2006, and entitled "Method for Generating and Adjusting Selected Word Line Voltage," the disclosure of which is incorporated herein by reference.

FIELD OF THE INVENTION

The present invention relates generally to semiconductors and, more particularly, to selected word line voltage generation and adjustment.

BACKGROUND

A memory can store information in an array of transistors. A threshold voltage associated with transistors is the gate voltage required to form a conducting channel. For example, an n-channel enhancement-type metal oxide semiconductor field-effect transistor (NMOS transistor) includes a source region, a drain region, and a gate region. When a positive voltage is applied to the gate of the NMOS transistor, the positive voltage attracts electrons from the source and drain regions into a channel region of the NMOS transistor. When a sufficient number of electrons accumulate near the surface of the substrate, a channel for current flow from the drain region to the source region is created. The threshold voltage is the voltage at which a sufficient number of mobile electrons accumulate into a channel region to form a conducting channel.

Each memory cell is connected to a word line and a bit line. Accordingly, each memory cell can be addressed by a word line signal and a bit line signal. Each memory cell can be selected for reading, verifying, programming, or erasing by activating the word line and the bit line. For example, programming is obtained by applying a voltage to the selected word line, which connects to the gates of the transistors, and biasing the bit line, which connects to the drain regions of the transistors. A read or verify operation is generally performed by applying a selected word line voltage to the memory cell and sensing the current flowing through the memory cell by way of its respective bit line.

Since the current flowing through the memory cells varies with temperature, the threshold voltage varies with temperature. Similarly, the selected word line voltage also varies with temperature. However, the selected word line voltage and the threshold voltage vary differently with temperature change. In other words, when compared to the threshold voltage, the selected word line voltage varies with temperature at a different rate or has a different temperature coefficient (volts/temperature). Since the reliability of read and verify operations strongly depends on selected word line voltage and threshold voltage distributions, such rate differences result in unreliable or erroneous read and verify operations. Non-volatile memories that store more than one bit in a transistor associated with a memory cell are particularly sensitive to threshold voltage distributions because the non-volatile memories are required to have a fine control of threshold voltage distributions of programmed memory cells.

As a result, there is a need for continuing efforts to improve the reliability of read and verify operations.

SUMMARY

Various embodiments of the present invention provide methods and/or circuitries for selected word line voltage generation and adjustment. It should be appreciated that the embodiments can be implemented in numerous ways, including as a method, a circuit, a system, or a device. An embodiment of the present invention is described below.

In accordance with an embodiment of the present invention, a memory device is provided. The memory device includes a memory array with memory cells and a row decoder connected to the memory array. The row decoder is configured to select a word line connected to the memory cells. Additionally included is a word line voltage generator that is configured to generate a selected word line voltage based on a difference between a constant voltage that is substantially independent of a temperature change and a voltage that varies in proportion to an absolute temperature, where an absence of the voltage that varies in proportion to the absolute temperature corresponds to the absolute temperature of absolute zero.

Other embodiments and advantages of the invention are apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION

A detailed description of one or more embodiments is provided below along with accompanying figures. The detailed description is provided in connection with such embodiments, but is not limited to any particular embodiment. The scope is limited only by the claims and numerous alternatives, modifications, and equivalents are encompassed. Numerous specific details are set forth in the following description in order to provide a thorough understanding. These details are provided for the purpose of example and the described embodiments may be implemented according to the claims without some or all of these specific details. For the purpose of clarity, technical material that is known in the technical fields related to the embodiments has not been described in detail to avoid unnecessarily obscuring the description.

The embodiments described herein provide methods and/or circuitries for generating and adjusting a selected word line voltage. In some embodiments, a selected word line voltage is generated by subtracting a voltage that varies in proportion to a temperature from a constant voltage that is substantially independent of a temperature change. As will be explained in detail below, the resulting selected word line voltage has a temperature coefficient that is substantially equal to the temperature coefficient associated with the threshold voltage of transistors associated with memory cells. To adjust the selected word line voltage, in some embodiments, measurements are taken of selected word line voltages generated with and in the absence of a current that varies in proportion to an absolute temperature. As will be explained in detail below, a temperature coefficient associated with the selected word line voltage can be calculated based on the measurements and, in an embodiment, the supply of current that varies in proportion to the absolute temperature can be changed such that the temperature coefficients associated with the selected word line voltage and the threshold voltage are substantially equal.

Figure 1:
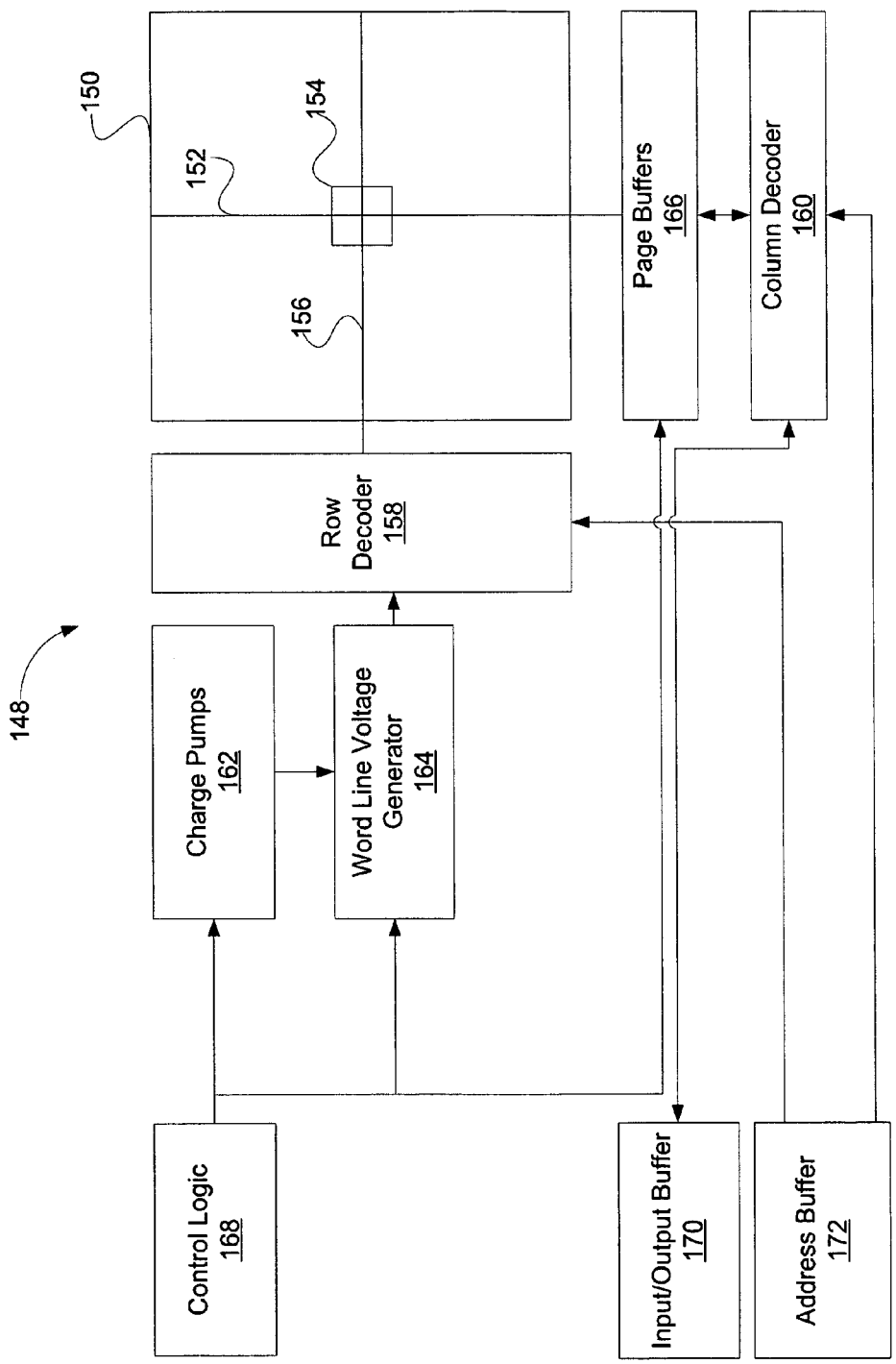
FIG. 1 is a simplified block diagram of a memory device, in accordance with an embodiment.

FIG. 1 is a simplified block diagram of a memory device, in accordance with an embodiment. As shown in FIG. 1, memory device 148 includes memory array 150, row decoder 158, column decoder 160, charge pumps 162, word line voltage generator 164, page buffers 166, control logic 168, input/output buffer 170, and address buffer 172. Memory array 150 comprises memory cells, such as memory cell 154, in which bits are stored. Memory cell 154 is an array of transistors capable of storing one or more bits and is connected to one of the word lines, such as word line 156, and one of the bit lines, such as bit line 152. Memory cell 154 is selected for reading, verifying, programming, or erasing by activating word line 156 and bit line 152 connected to the memory cell.

Row decoder 158 may be a combinational logic circuit that is configured to select (or raise the voltage of) word line 156 based on a row address provided by address buffer 172. Charge pumps 162 are configured as booster circuits to increase the external supply voltage to, for example, four volts, and supply the voltage to word line voltage generator 164. As will be explained in more detail below, in some embodiments, word line voltage generator 164 may include digital-to-analog converters, constant voltage generation circuit, proportional to absolute temperature (PTAT) circuit, subtraction circuit, and other circuits that are configured to generate a selected word line voltage, which is applied by way of row decoder 158 to selected word line 156.

Page buffers 166 are connected to bit lines, such as bit line 152, and supply bit line voltages for read, verify, program, and erase operations. For read and verify operations, page buffers 166 amplify voltages on the bit lines to full-swing digital signals. Column decoder 160 is configured to select one of page buffers 166 based on a column address provided by address buffer 172. The read-out signal provided by column decoder 160 is transferred to input/output buffer 170. Control logic 168 generates control signals to control the various circuitries of memory device 148.

Selected Word Line Voltage Generation

Figure 2:
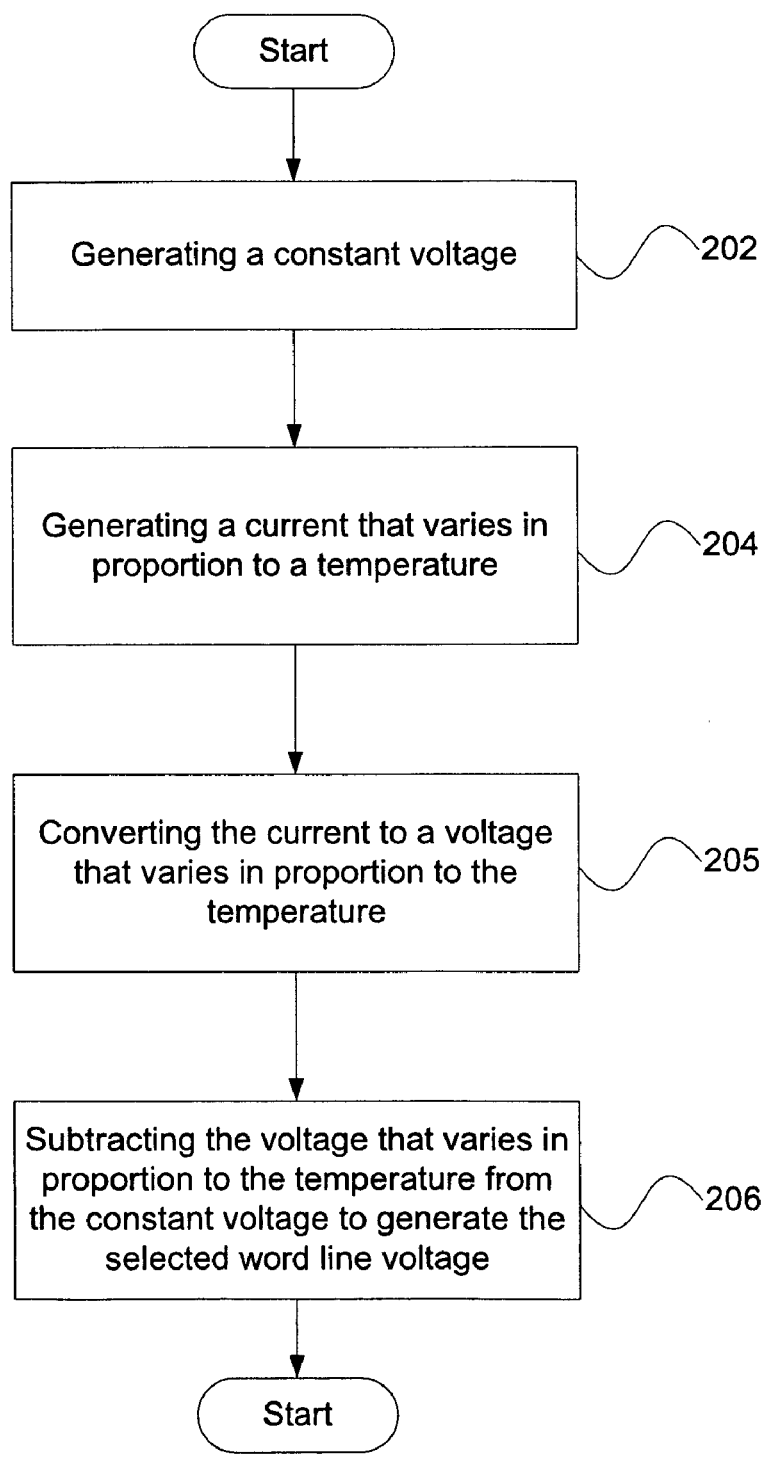
FIG. 2 is a flowchart diagram of a high level logic overview for generating a selected word line voltage, in accordance with an embodiment.

FIG. 2 is a flowchart diagram of a high level logic overview for generating a selected word line voltage, in accordance with an embodiment. As shown in FIG. 2, a constant voltage that is substantially independent of a temperature change is generated in operation 202. In other words, the constant voltage is a voltage that is substantially constant over a temperature range. As used herein, the term "substantially" means that the specified dimension or parameter may extend within an acceptable tolerance for a given application. In some embodiments, acceptable tolerances range from 90% to 100%.

At substantially the same time, a current that varies in proportion to a temperature is generated in operation 204. In some embodiments, the temperature is the absolute (or thermodynamic) temperature. As will be explained in more detail below, the current that varies in proportion to the absolute temperature has a linear relationship with the absolute temperature, which is given in kelvin (K). Such a linear relationship results in a current that varies in proportion to the absolute temperature with a substantially constant temperature coefficient.

To generate the selected word line voltage, the current that varies in proportion to the temperature is converted to a voltage that varies in proportion to the temperature in operation 205. The voltage that varies in proportion to a temperature then is subtracted from the constant voltage in operation 206. In other words, the selected word line voltage is generated based on a difference between the constant voltage and the voltage that varies in proportion to a temperature. As a result of the subtraction, the temperature coefficient associated with the selected word line voltage is substantially equal to a temperature coefficient associated with the threshold voltage.

Figure 3:
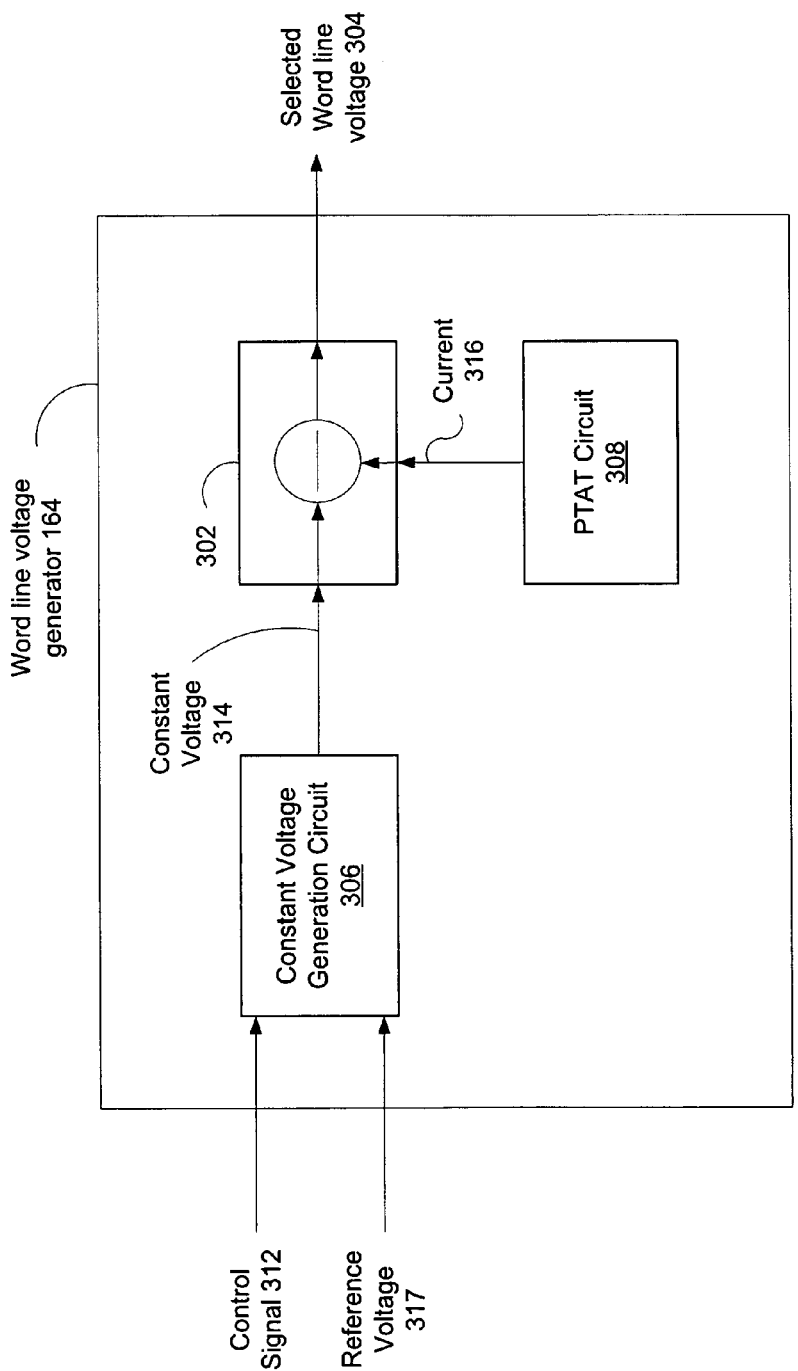
FIG. 3 is a detailed block diagram of the word line voltage generator shown in FIG. 1, in accordance with an embodiment.

FIG. 3 is a detailed block diagram of the word line voltage generator shown in FIG. 1, in accordance with an embodiment. As shown in FIG. 3, word line voltage generator 164 includes constant voltage generation circuit 306, PTAT circuit 308, and subtraction circuit 302. Constant voltage generation circuit 306 is configured to generate constant voltage 314 that is substantially independent of a temperature change. PTAT circuit 308 is configured to generate current 316 that varies in proportion to an absolute temperature. Subtraction circuit 302 is configured to generate selected word line voltage 304 based on constant voltage 314 and current 316 supplied from constant voltage generation circuit 306 and PTAT circuit 308, respectively.

Constant voltage generation circuit 306 generates constant voltage 314 based on control signal 312 and reference voltage 317. Reference voltage 317 is a fixed, direct current voltage that does not vary or change with temperature. In other words, reference voltage 317 is substantially independent of a temperature change. It should be appreciated that reference voltage 317 may be generated by a variety of known band-gap reference circuits. A control logic, such as control logic 168 of FIG. 1, supplies control signal 312 to constant voltage generation circuit 306 by way of a digital-to-analog converter. In general, control signal 312 specifies the voltage level applied to a selected word line. The voltage level specifies whether the operation is a read operation or a verify operation. For example, with NAND flash memories, a verify operation has a higher voltage applied to the word line when compared to a read operation. Control signal 312 and reference voltage 317 are supplied to constant voltage generation circuit 306. Constant voltage generation circuit 306 includes a voltage multiplier and, to generate constant voltage 314, the voltage multiplier magnifies reference voltage 317 based on control signal 312, where the control signal specifies the magnification of the reference voltage.

Constant voltage generation circuit 306 supplies constant voltage 314 to subtraction circuit 302. At the same time, as will be explained in more detail below, PTAT circuit 308 generates and supplies current 316 that varies in proportion to the absolute temperature to subtraction circuit 302. Subtraction circuit 302 converts current 316 to a voltage that varies in proportion to the absolute temperature and generates selected word line voltage 304 based on a difference between constant voltage 314 and voltage that varies in proportion to the absolute temperature. For example, in an embodiment, subtraction circuit 302 subtracts voltage that varies in proportion to the absolute temperature from constant voltage 314 to generate selected word line voltage 304. It should be appreciated that in other embodiments, word line voltage generator 164 may include fewer, more, or different circuitry apart from that shown in FIG. 3. For example, in another embodiment, word line voltage generator 164 does not include PTAT circuit 308 and the PTAT circuit is instead located outside the word line voltage generator.

Figure 4:
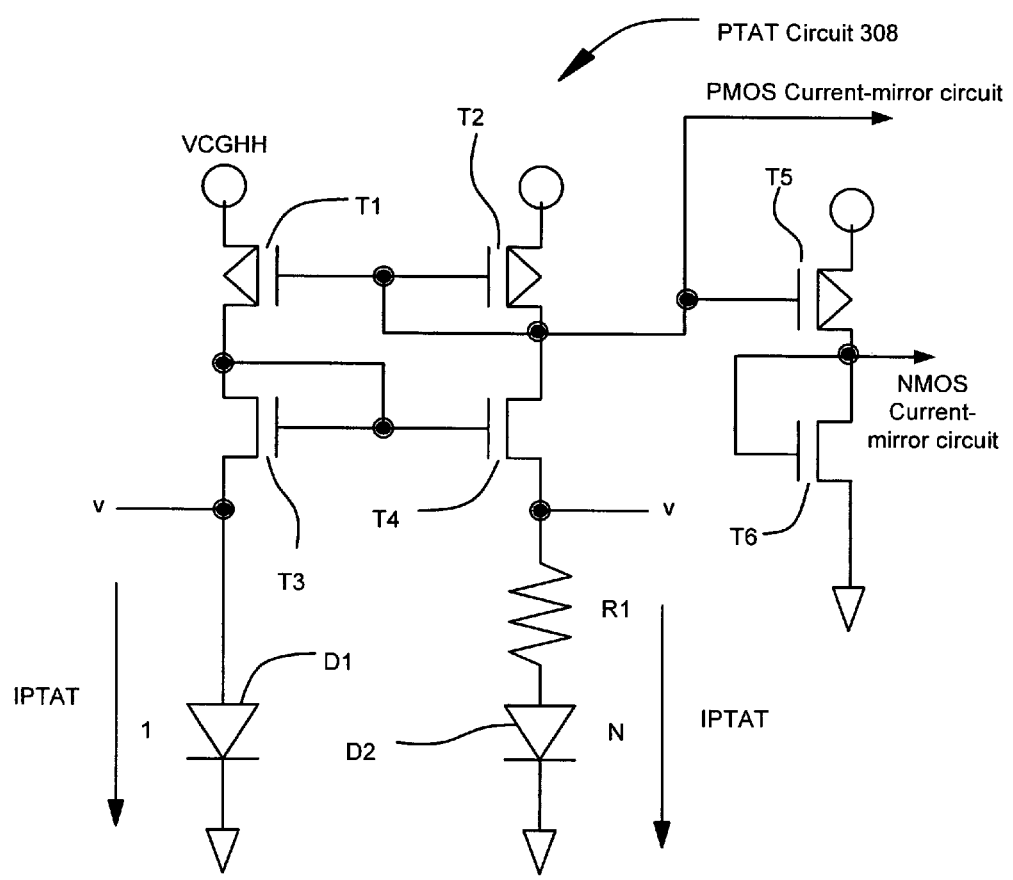
FIG. 4 is a schematic diagram of the proportional to absolute temperature (PTAT) circuit shown in FIG. 3, in accordance with an embodiment.

FIG. 4 is a schematic diagram of the PTAT circuit shown in FIG. 3, in accordance with an embodiment. As shown in FIG. 4, PTAT circuit 308 includes p-channel enhancement-type metal oxide semiconductor field-effect transistors (PMOS transistors) T1, T2, and T5, n-channel enhancement-type metal oxide semiconductor field-effect transistors (NMOS transistors) T3, T4, and T6, resistor R1, and diodes D1 and D2. PMOS transistors T1 and T2 have the same dimension (channel width/channel length). NMOS transistors T3 and T4 also have the same dimension. The source of PMOS transistor T1 is connected to voltage VCGHH and the drain of the PMOS transistor is connected to the drain and the gate of NMOS transistor T3. The source of NMOS transistor T3 is connected to the anode of diode D1. The cathode of diode D1 is connected to a ground node. Furthermore, the source of PMOS transistor T2 is connected to voltage VCGHH and the gate and the drain of PMOS transistor T2 is connected to the gate of PMOS transistor T1 and the drain of NMOS transistor T4. In addition, the gate of NMOS transistor T4 is connected to the gate of NMOS transistor T3. The source of NMOS transistor T4 is connected to an end of resistor R1. The other end of resistor R1 is connected to an anode of diode D2. The cathode of diode D2 is connected to a ground node.

Additionally, the source of PMOS transistor T5 is connected to voltage VCGHH and the gate of PMOS transistor T5 is connected to a node connecting the gates of PMOS transistors T1 and T2 and the drains of PMOS transistor T2 and NMOS transistor T4. The node connecting the gates of PMOS transistors T1, T2, and T5 and the drains of PMOS transistor T2 and NMOS transistor T4 is connected to PMOS current-mirror transistors in the subtraction circuits described below. The drain and the gate of NMOS transistor T6 is connected to the drain of PMOS transistor T5 and the source of NMOS transistor T6 is connected to a ground node. The gate of NMOS transistor T6 is connected to NMOS current-mirror transistors in the subtraction circuits described below.

Voltage VCGHH is applied to sources of PMOS transistors T1 and T2. Since the threshold voltage associated with transistors of memory cells can be higher than the internal power supply voltage of a memory device, in an embodiment, the voltage VCGHH is higher than the internal power supply voltage. For example, voltage VCGHH may equal to four volts and may be generated by one or more charge pumps, such as the charge pumps of FIG. 1. On the other hand, if the threshold voltage is lower than the internal power supply voltage, then voltage VCGHH may equal to the internal power supply voltage, in accordance with another embodiment.

Still referring to FIG. 4, voltage v can be expressed as $$v = V_T \ln(IPTAT/Is) = R1*IPTAT + V_T(\ln(IPTAT/Is) - \ln(N)) \quad (1.0)$$

where $V_T$ is the threshold voltage ($V_T = kT/q$, where k is the Boltzmann's constant ($1.38 \times 10^{-23}$ joules/kelvin), T is the absolute temperature (in kelvins), and q is the magnitude of electronic charge ($1.60 \times 10^{-19}$ coulomb)) and Is is the saturation current of diode D1. Here, N is the ratio between emission coefficients of diodes D1 and D2, which can be expressed as a ratio of N to 1. Thus, emission coefficient of diode D2 is N times larger than the emission coefficient of diode D1. Simplifying Equation (1.0) yields $$R1*IPTAT - V_T \ln(N) = 0$$

Since $V_T = kT/q$, then current IPTAT flowing through transistors T1-T4 can be expressed as $$IPTAT = kT/q * \ln(N)/R1 \quad (1.2)$$

Figure 5:
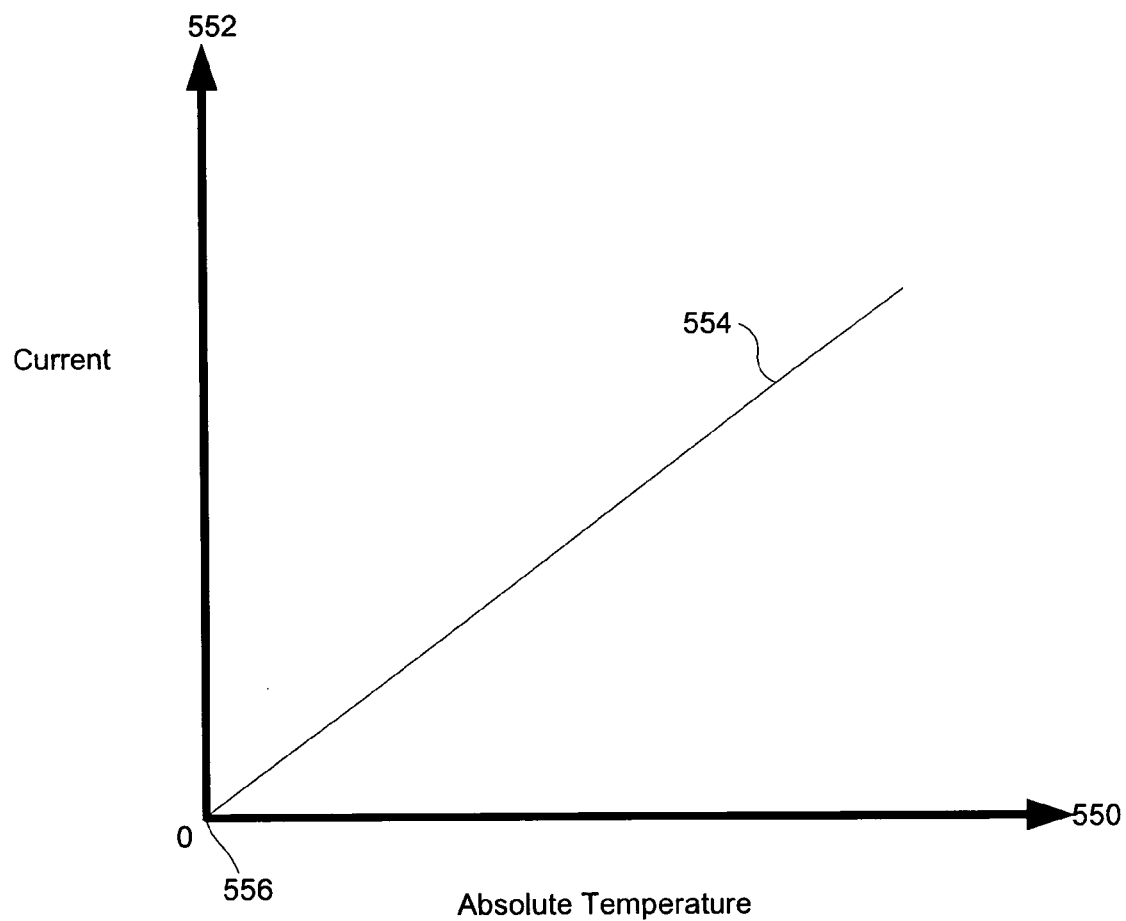
FIG. 5 is a graph of the current that varies in proportion to an absolute temperature.

As shown in Equation (1.2), PTAT circuit 308 generates a current (IPTAT) that varies in proportion to the absolute temperature T. FIG. 5 is a graph of Equation (1.2). As shown in FIG. 5, horizontal axis 550 is defined by the absolute temperature and vertical axis 552 is defined by the current as expressed in Equation (1.2). The graph of Equation (1.2) is a straight line 554 with a constant slope. Thus, the current has a linear relationship with the absolute temperature. Accordingly, the current as expressed in Equation (1.2) varies in proportion to the absolute temperature. For example, if R1=30 kΩ, N=100, and T=300K, then IPTAT=4 uA. Furthermore, straight line 554 intersects at origin 556, where both current and absolute temperature equal to zero. Therefore, in some embodiments, an absence of current that varies in proportion to the absolute temperature corresponds to the absolute temperature of absolute zero. In other words, a current with a zero current value corresponds to absolute zero. For example, if IPTAT=0, then absolute temperature=0 K. Further, since voltage that varies in proportion to the absolute temperature is based on current that varies in proportion to the absolute temperature, an absence of voltage that varies in proportion to the absolute temperature also corresponds to the absolute temperature of absolute zero.

FIGS. 6A-6D are schematic diagrams of various embodiments of the subtraction circuit shown in FIG. 3. In the embodiment shown in FIG. 6A, subtraction circuit 302 includes PMOS transistors T10-T12, PMOS current-mirror transistor T13, resistors R10-14, and operational amplifiers OP10 and OP11. PMOS transistors T10 and T11 have the same dimension. The source of PMOS transistor T10 is connected to voltage VCGHH and the drain of the PMOS transistor is connected to an end of resistor R10. An end of resistor R11 is connected to the other end of resistor R10 and the other end of resistor R11 is connected to a ground node. The source of PMOS transistor T11 is connected to voltage VCGHH and the drain of the PMOS transistor is connected to an end of resistor R12. The other end of resistor R12 is connected to an end of resistor R13. The other end of resistor R13 is connected to a ground node. The drain of PMOS current-mirror transistor T13 is connected to a node connecting resistors R10 and R11. Further, the source of PMOS transistor T12 is connected to voltage VCGHH and the drain of the PMOS transistor is connected to an end of resistor R14. The other end of resistor R14 is connected to a ground node. The output of operational amplifier OP10 is connected to the gates of PMOS transistors T10 and T11. The non-inverting input of operational amplifier OP10 is connected to a node connecting PMOS transistor T10 and resistor RIO. Constant voltage 314 is applied to the inverting input of operational amplifier OP10. The output of operational amplifier OP11 is connected to the gate of PMOS transistor T12, and the non-inverting input of the operational amplifier is connected to a node connecting PMOS transistor T12 and resistor R14.

Voltage VCGHH is applied to the sources of PMOS transistors T10, T11, and T12 and power supplies of operational amplifiers OP10 and OP11. Constant voltage 314, which is outputted from a constant voltage generation circuit, is applied to the inverting input of operational amplifier OP10. The IPTAT generated by a PTAT circuit flows through PMOS current-mirror transistor T13. As a result, constant voltage 314 can be expressed as $$\text{constant voltage} = I*R + (I + IPTAT)*r \qquad (2.0)$$

where I is the current flowing through PMOS transistors T10 and T11, R is the resistance value associated with resistors R10 and R12, and r is the resistance value associated with resistors R11 and R13. The voltage at inverting input of operational amplifier OP11 can be expressed as $$v = I*R + I*r \qquad (2.2)$$

Since voltage as expressed in Equation (2.2) is virtually connected by way of operational amplifier OP11 to the node associated with selected word line voltage 304, the voltage of Equation (2.2) is selected word line voltage 304. By combining Equations (2.0) and (2.2), selected word line voltage 304 can be expressed as $$\text{selected word line voltage} = \text{constant voltage} - r*IPTAT \qquad (2.4)$$

Equation (2.4) shows that selected word line voltage 304 is the difference between constant voltage 314 and the voltage that varies in proportion to the absolute temperature, where resistors R11 and R13 with resistance value r act to convert the current that varies in proportion to the absolute temperature to the voltage that varies in proportion to the absolute temperature. As an example, if IPTAT=1.32e−8*T and r=130 kΩ, then selected word line voltage 304 is equal to constant voltage −1.7e−3*T.

Figure 6A:
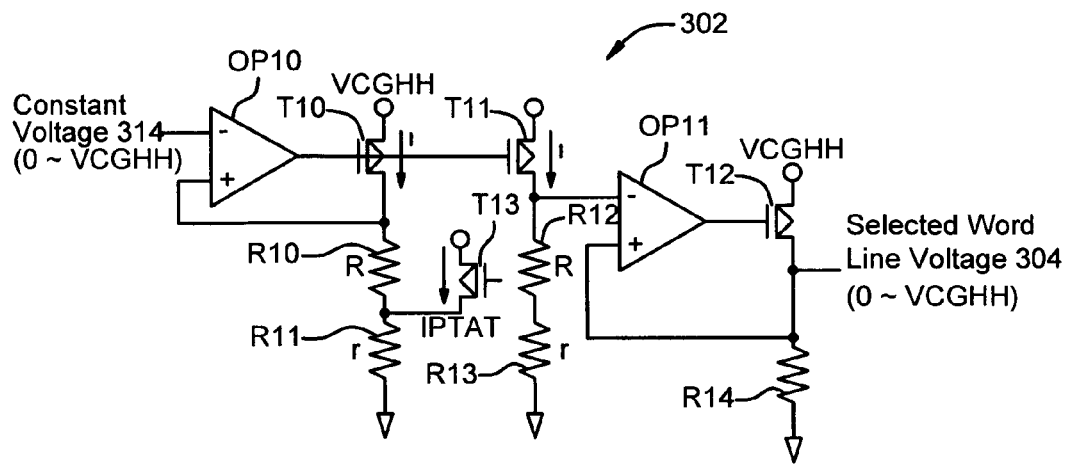
FIGS. 6A–6D are schematic diagrams of various embodiments of the subtraction circuit shown in FIG. 3.
Figure 6B:
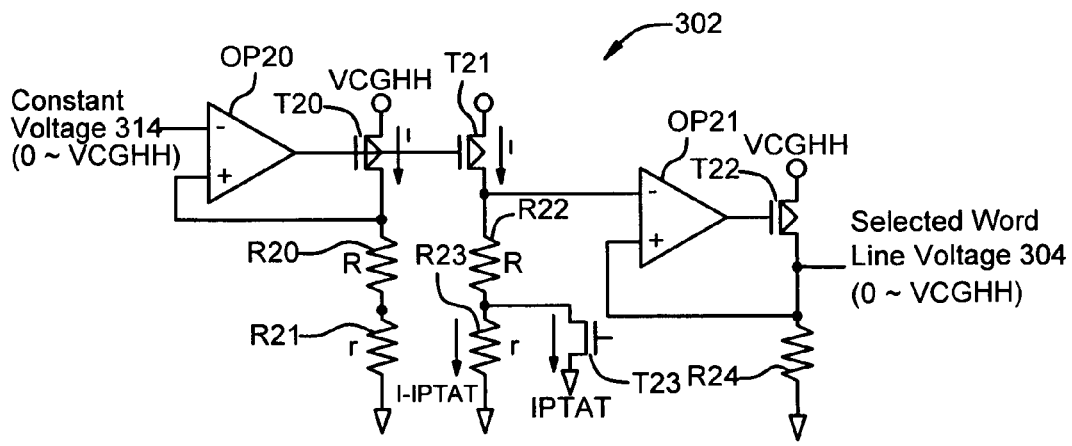

In the embodiment shown in FIG. 6B, subtraction circuit 302 includes PMOS transistors T20-T22, resistors R20-24, NMOS current-mirror transistor T23, and operational amplifiers OP20 and OP21. The circuit layout of subtraction circuit 302 shown in FIG. 6B is identical to the circuit layout of the subtraction circuit shown in FIG. 6A with the exception of NMOS current-mirror transistor T23. Unlike the subtraction circuit of FIG. 6A, no transistor is connected between resistors R20 and R21. Instead, the drain of NMOS current-mirror transistor T23 is connected to a node connecting resistors R22 and R23. The source of NMOS current-mirror transistor T23 is connected to a ground node.

In the embodiment shown in FIG. 6B, voltage VCGHH is applied to the sources of PMOS transistors T20 and T22. Constant voltage 314 is applied to the inverting input of operational amplifier OP20. IPTAT flows through NMOS current-mirror transistor T23. Constant voltage 314 can therefore be expressed as $$\text{constant voltage} = I*R + I*r \qquad (3.0)$$

where I is the current flowing through PMOS transistors T20 and T21, R is the resistance value associated with resistors R20 and R22, and r is the resistance value associated with resistors R21 and R23. Selected word line voltage 304 can be expressed as $$\text{selected word line voltage} = I*R + (I - IPTAT)*r \qquad (3.2)$$

By combining Equations (3.0) and (3.2), selected word line voltage 304 can be expressed as $$\text{selected word line voltage} = \text{constant voltage} - r*IPTAT \qquad (3.4)$$

Equation (3.4) shows that selected word line voltage 304 is the difference between constant voltage 314 and the voltage that varies in proportion to the absolute temperature.

Figure 6C:
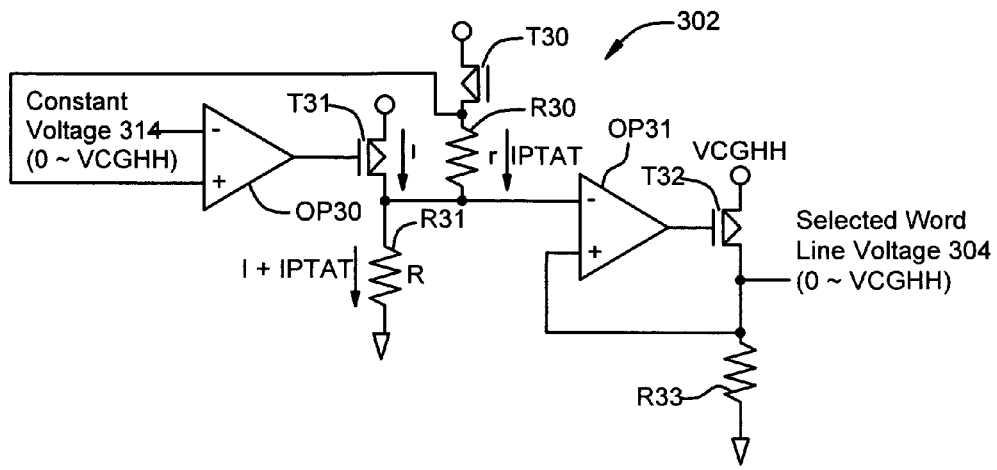

In the embodiment shown in FIG. 6C, subtraction circuit 302 includes PMOS transistors T31-T32, PMOS current-mirror transistor T30, resistors R30, R31, and R33, and operational amplifiers OP30-OP31. The source of PMOS transistor T31 is connected to voltage VCGHH and the drain of the PMOS transistor is connected to an end of resistor R31. The other end of resistor R31 is connected to a ground node. The drain of PMOS transistor T31 also is connected to an end of resistor R30 and the other end of the resistor is connected to the drain of PMOS current-mirror transistor T30. The source of PMOS current-mirror transistor T30 is connected to voltage VCGHH. The output of operational amplifier OP30 is connected to the gate of PMOS transistor T31. Constant voltage 314 is applied to the inverting input of operational amplifier OP30 and the non-inverting input of the operational amplifier is connected to a node connecting PMOS current-mirror transistor T30 and resistor R30. Furthermore, the source of PMOS transistor T32 is connected to voltage VCGHH and the drain of the PMOS transistor is connected to an end of resistor R33. The other end of resistor R33 is connected to a ground node. The output of operational amplifier OP31 is connected to the gate of PMOS transistor T32, the non-inverting input of the operational amplifier is connected to a node connecting PMOS transistor T32 and resistor R33, and the inverting input of the operational amplifier is connected to an end of resistor R30 and a node connecting PMOS transistor T31 and resistor R31.

In the embodiment of FIG. 6C, voltage VCGHH is applied to the sources of PMOS transistors T31 and T32, source of PMOS current-mirror transistor T30, and power supplies of operational amplifiers OP30 and OP31. Constant voltage 314 is applied to the inverting input of operational amplifier OP30. The IPTAT flows through PMOS current-mirror transistor T30. As a result, constant voltage 314 can be expressed as $$\text{constant voltage} = IPTAT*r + (I + IPTAT)*R \qquad (4.0)$$

where I is the current flowing through PMOS transistor T31 and resistor R32, and R is the resistance value associated with resistor R31. Selected word line voltage 304 can be expressed as $$\text{selected word line voltage} = (I + IPTAT)*R \qquad (4.2)$$

By combining Equations (4.0) and (4.2), selected word line voltage 304 can be expressed as selected word line voltage=constant voltage−
r*IPTAT     (4.4)

Equation (4.4) shows that selected word line voltage 304 is the difference between constant voltage 314 and the voltage that varies in proportion to the absolute temperature.

Figure 6D:
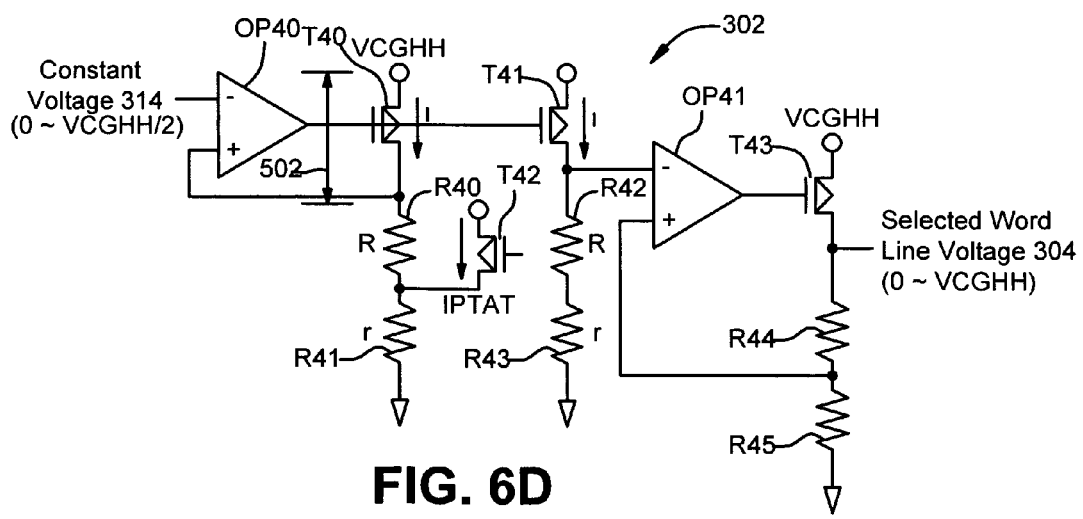

In the embodiment shown in FIG. 6D, subtraction circuit 302 includes PMOS transistors T40, T41, and T43, PMOS current-mirror transistor T42, resistors R40-R45, and operational amplifiers OP40 and OP41. The PMOS transistors T40 and T41 have the same dimension. The source of PMOS transistor T40 is connected to voltage VCGHH and the drain of the PMOS transistor is connected to an end of resistor R40. The other end of resistor R40 is connected to an end of resistor R41. The other end of resistor R41 is connected to a ground node. The drain of PMOS current-mirror transistor T42 is connected to a node connecting resistors R40 and R41. Furthermore, the source of PMOS transistor T41 is connected to voltage VCGHH and the drain of the PMOS transistor is connected to an end of resistor R42. The other end of resistor R42 is connected to an end of resistor R43. The other end of resistor R43 is connected to a ground node. The source of PMOS transistor T43 is connected to voltage VCGHH and the drain of the PMOS transistor is connected to an end of resistor R44. The other end of resistor R44 is connected to an end of resistor R45. The other end of resistor R45 is connected to the ground node. The output of operational amplifier OP40 is connected to the gates of PMOS transistors T40 and T41. Constant voltage 314 is applied to the inverting input of operational amplifier OP40. The non-inverting input of operational amplifier OP40 is connected to a node connecting PMOS transistor T40 and resistor R40. The output of operational amplifier OP41 is connected to the gate of PMOS transistor T43. The non-inverting input of operational amplifier OP41 is connected to a node connecting resistors R44 and R45. The inverting input of operational amplifier OP41 is connected to a node connecting PMOS transistor T41 and resistor R42. With the circuit layout shown in FIG. 6D, space 502 located between source of PMOS transistor T40 and an end of resistor R40 provides enough space or head room to accommodate a PMOS current mirror circuit (not shown).

In the embodiment of FIG. 6D, voltage VCGHH is applied to the sources of PMOS transistors T40, T41, and T43, source of PMOS current-mirror transistor T42, and power supplies of operational amplifiers OP40 and OP41. Constant voltage 314 is applied to the inverting input of operational amplifier OP40. The resistance values of R44 and R45 may be substantially the same and thus, selected word line voltage 304 may be twice as high as the voltage inputted into operational amplifier OP41. Therefore, the operation range of constant voltage 314 can be between zero (0) volts to half of voltage VCGHH. The IPTAT flows through PMOS current-mirror transistor T42. As a result, constant voltage 314 can be expressed as constant voltage=$I*R+(I+IPTAT)*r$     (5.0)

where I is the current flowing through PMOS transistors T40 and T41, R is the resistance value associated with resistors R40 and R42, and r is the resistance value associated with resistors R41 and R43. Selected word line voltage 304 can be expressed as selected word line voltage/2=$I*R+I*r$     (5.2)

By combining Equations (5.0) and (5.2), selected word line voltage 304 can be expressed as selected word line voltage=2*constant voltage−
2*r*IPTAT     (5.4)

Equation (5.4) shows that selected word line voltage 304 is the difference between constant voltage 314 and the voltage that varies in proportion to the absolute temperature.

Figure 7:
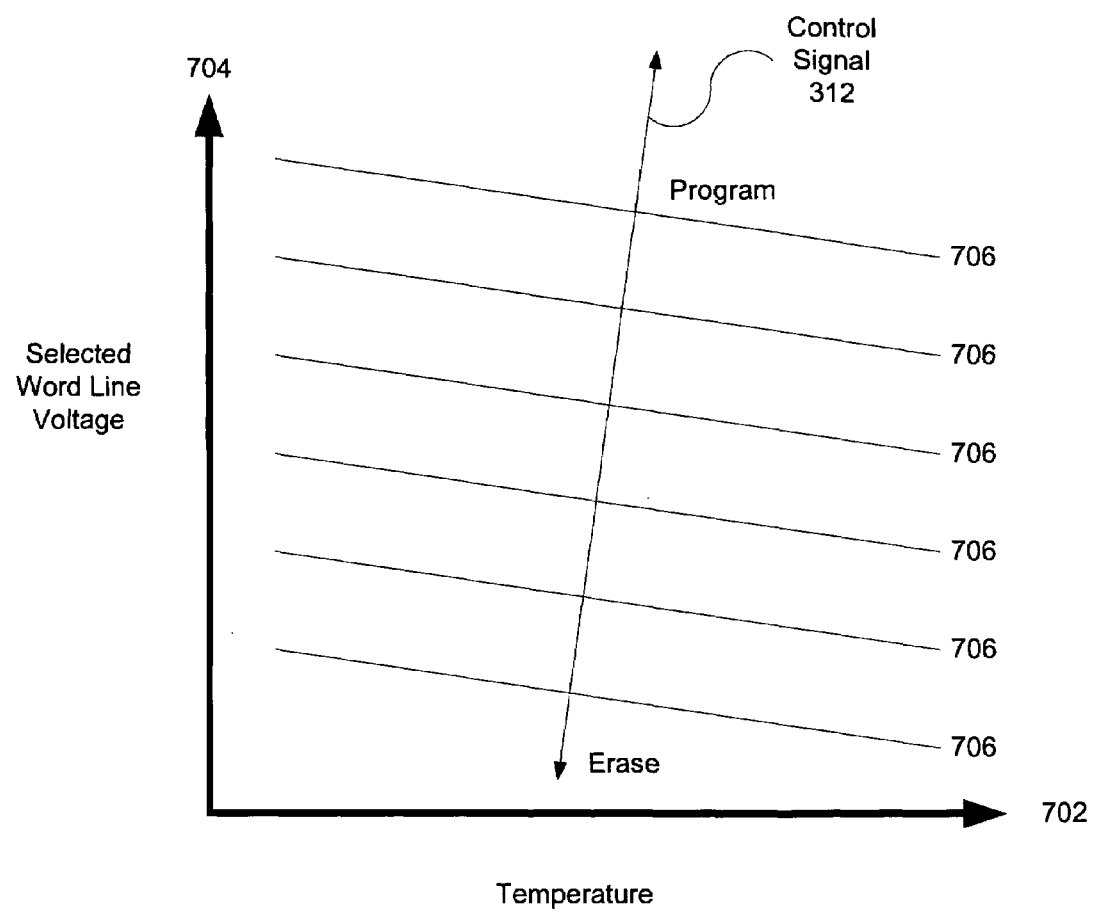
FIG. 7 is a graph of the selected word line voltages generated by the word line voltage generator.

FIG. 7 is a graph of the selected word line voltages generated by the word line voltage generator. As shown in FIG. 7, horizontal axis 702 is defined by a temperature and vertical axis 704 is defined by the selected word line voltage. Each line 706 is a graph of the selected word line voltage at different control signal ranges (e.g., read and verify voltage levels of each programmed threshold voltage distribution). Since each line 706 is straight with constant slope, the temperature coefficient associated with the selected word line voltage is substantially constant over a temperature range. Additionally, the resulting temperature coefficient associated with the selected word line voltage is substantially equal to a temperature coefficient associated with the threshold voltage. Furthermore, as shown in FIG. 7, each line 706 associated with various control signal ranges has the same, constant slope. Thus, the temperature coefficients associated with selected word line voltages are substantially constant and substantially continuous over a control signal range. As a result, control signal 312 graphs as a straight line.

Selected Word Line Voltage Adjustment

Figure 8:
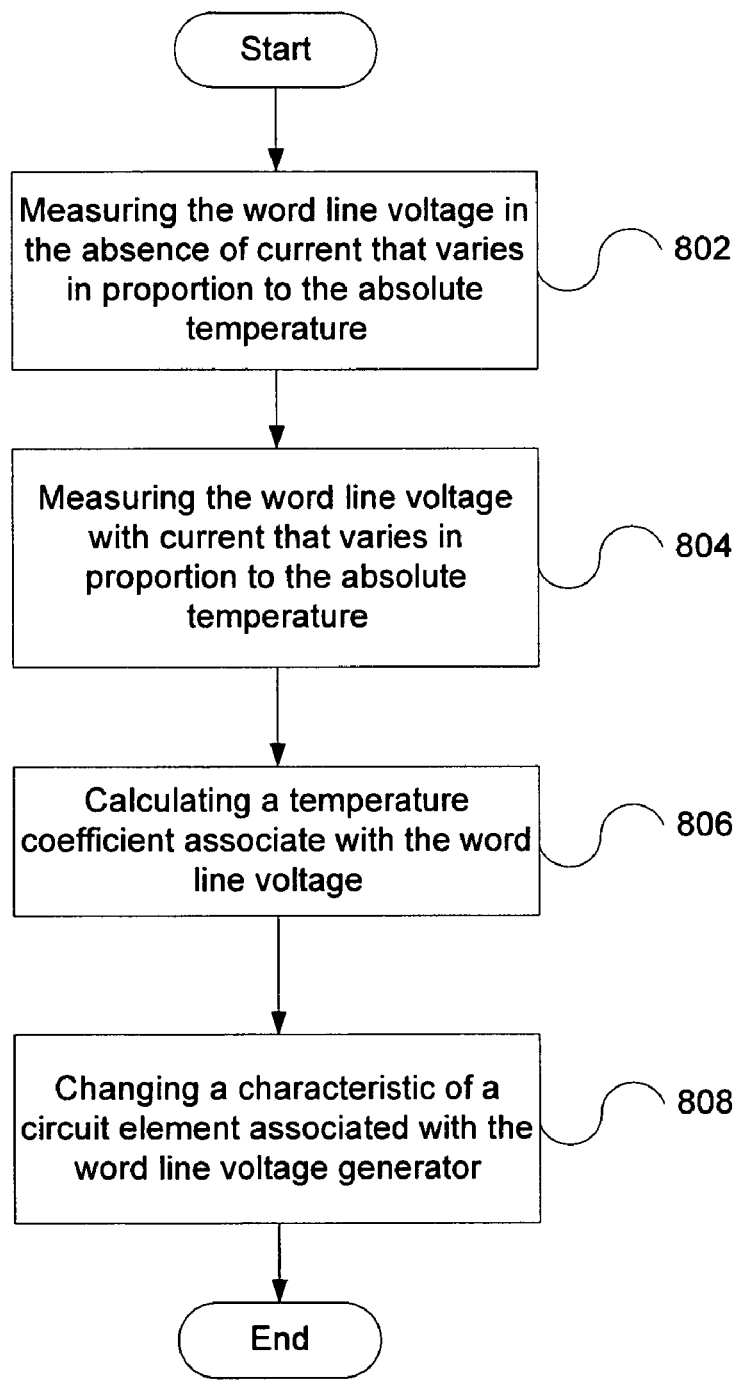
FIG. 8 is a flowchart diagram of a general overview of operations for adjusting the selected word line voltage, in accordance with an embodiment.

FIG. 8 is a flowchart diagram of a general overview of operations for adjusting the selected word line voltage, in accordance with an embodiment. Starting in operation 802, a selected word line voltage is measured in the absence of the current that varies in proportion to the absolute temperature. In other words, a measurement is taken of a selected word line voltage that is generated by the word line voltage generator without the current that varies in proportion to the absolute temperature. Instead, the word line voltage generator generates the selected word line voltage based on a constant voltage that is substantially independent of a temperature change.

Thereafter, in operation 804, another measurement of the world line voltage is taken with the current that varies in proportion to the absolute temperature supplied to the word line voltage generator. Thus, the word line voltage generator generates the selected word line voltage based on both the constant voltage that is substantially independent of a temperature change and the current that varies in proportion to the absolute temperature.

With both measurements, the temperature coefficient associated with the selected word line voltage can be calculated in operation 806. As will be explained in detail below, the temperature coefficient can be calculated based on the selected word line voltages generated with and in the absence of current that varies in proportion to the absolute temperature. It should be noted that the temperature coefficient associated with the selected word line voltage can be adjusted by changing a characteristic of a circuit element associated with the word line voltage generator. For example, as described in more detail below, a characteristic of a circuit element associated with a PTAT circuit can be changed. In another embodiment, a characteristic of a circuit element associated with a subtraction circuit can be changed. With the calculated temperature coefficient, a characteristic of a circuit element associated with the word line voltage generator is changed in operation 808 such that the word line voltage generator generates a selected word line voltage with a temperature coefficient that is substantially equal to the temperature coefficient associated with a threshold voltage.

Figure 9:
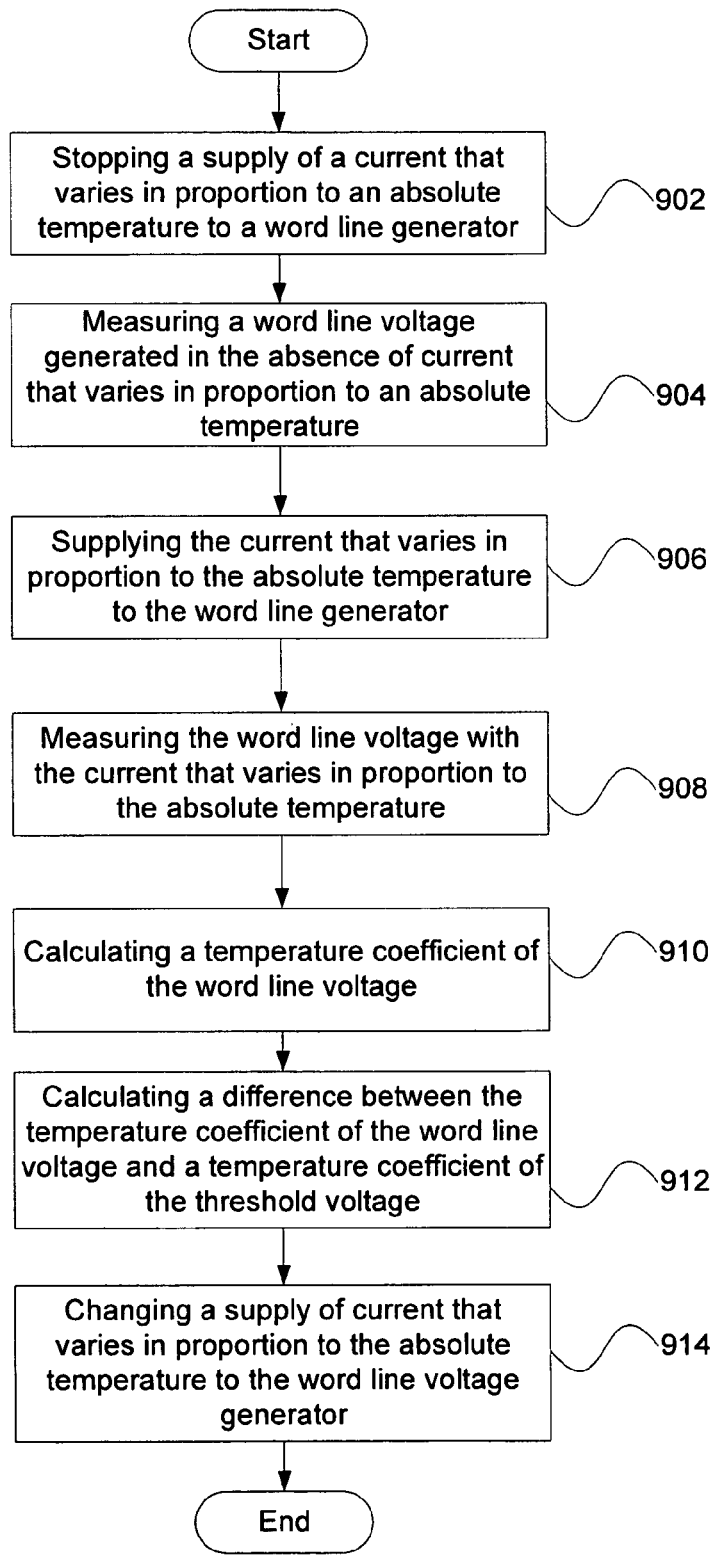
FIG. 9 is a flowchart diagram of detailed operations for adjusting the selected word line voltage, in accordance with an embodiment.

FIG. 9 is a flowchart diagram of detailed operations for adjusting the selected word line voltage, in accordance with an embodiment. As shown in FIG. 9, a supply of the current to the word line voltage generator is stopped in operation 902 to measure the selected word line voltage generated in the absence of a current that varies in proportion to the absolute temperature. In some embodiments, the PTAT circuit (e.g., the PTAT circuit of FIG. 4) may be turned off to stop the flow of current to a subtraction circuit, such as the subtraction circuits of FIGS. 6A-6D. In another embodiment, a transistor associated with the subtraction circuit may be configured to stop the flow of current. As a result, the word line voltage generator generates the selected word line voltage absent the current that varies in proportion to the absolute temperature. The word line voltage generator therefore generates the selected word line voltage based on a constant voltage that is substantially independent of a temperature change. After the supply of current is stopped, a measurement of the selected word line voltage is taken in operation 904.

Thereafter, in operation 906, a current that varies in proportion to the absolute temperature is supplied to the word line voltage generator. For example, in an embodiment, the PTAT circuit may be turned on to supply the subtraction circuit with the current generated by the PTAT circuit or, in another embodiment, a transistor associated with the subtraction circuit may be configured to allow a flow of current from the PTAT circuit. Thus, the word line voltage generator generates the selected word line voltage based on the current that varies in proportion to the absolute temperature, where the selected word line voltage is the difference between the voltage that varies in proportion to the absolute temperature and the constant voltage that is substantially independent of a temperature change. With the flow of current that varies in proportion to the absolute temperature, a measurement of the selected word line voltage is taken in operation 908. It should be appreciated that the measurements of the selected word line voltages as described in operations 904 and 908 may be measured by a variety of test equipments configured to measure voltages in memory devices.

With the measurements, the temperature coefficient of the selected word line voltage can be calculated in operation 910. As expressed above in Equation (1.2), the absence of the current that varies in proportion to the absolute temperature corresponds to the absolute temperature of absolute zero. Thus, in an embodiment, stopping the supply of the current configures the word line voltage generator to generate the selected word line voltage at an absolute temperature of absolute zero. With the relationship expressed in Equation (1.2), the temperature coefficient associated with the selected word line voltage can be expressed as $$\text{temperature\_coefficient} = \frac{V1 - V2}{T1 - 0K} \quad (6.0)$$

where V2 is the selected word line voltage generated in the absence of the current that varies in proportion to the absolute temperature, V1 is the selected word line voltage generated based on the current that varies in proportion to the absolute temperature, and T1 is the temperature associated with the selected word line voltage. Thus, Equation (6.0) shows that the temperature coefficient associated with the selected word line voltage is defined by a difference between the selected word line voltages generated with and in the absence of current that varies in proportion to the absolute temperature divided by a difference between an absolute temperature of absolute zero and an absolute temperature associated with the selected word line voltage.

After the temperature coefficient associated with the selected word line voltage is calculated, a difference can be calculated in operation 912 between the calculated temperature coefficient associated with the selected word line voltage and a temperature coefficient associated with the threshold voltage. With this calculated difference, the supply of current that varies in proportion to the absolute temperature can be changed in operation 914 to adjust the selected word line voltage generated by the word line voltage generator such that the difference is substantially zero. In other words, the supply of the current can be changed such that the temperature coefficient associated with the selected word line voltage is substantially equal to the temperature coefficient associated with the threshold voltage.

In an embodiment, the supply of current that varies in proportion to an absolute temperature may be increased or, in another embodiment, the supply of current can be decreased. In an embodiment, the supply of current that varies in proportion to the absolute temperature may be increased or decreased by changing the characteristic of a circuit element associated with the PTAT circuit shown in FIG. 4. For example, as expressed in Equation (1.2), the current that varies in proportion to the absolute temperature is dependent on the electrical resistance of resistor R1 and the emission coefficients of diodes D1 and D2 (i.e., ratio N). Thus, with reference to FIG. 4, in an embodiment, the supply of current that varies in proportion to the absolute temperature can be changed by changing the electrical resistance of a resistor associated with PTAT circuit 308 (e.g., resistor R1). For example, with reference to Equation (1.2), increasing the resistance value R1 decreases the flow of current that varies in proportion to the absolute temperature. As a result, the temperature coefficient associated with the current that varies in proportion to the absolute temperature decreases. On the other hand, decreasing the resistance value R1 increases the flow of current that varies in proportion to the absolute temperature. Thus, the temperature coefficient associated with the current that varies in proportion to the absolute temperature increases.

In another embodiment, the supply of current that varies in proportion to the absolute temperature can be changed by changing the emission coefficient of a diode associated with PTAT circuit 308 (e.g., emission coefficients of diode D1 and D2). For example, with reference to Equation (1.2), increasing the ratio N associated with diode D2 increases the flow of current that varies in proportion to the absolute temperature. As a result, the temperature coefficient associated with the current that varies in proportion to the absolute temperature increases. On the other hand, decreasing the ratio N associated with diode D2 decreases the flow of current that varies in proportion to the absolute temperature. Thus, the temperature coefficient associated with the current that varies in proportion to the absolute temperature decreases.

In addition to changing a supply of current, it should be appreciated that the selected word line voltage can also be adjusted by changing the characteristic of a circuit element associated with the subtraction circuit, in accordance with another embodiment. For example, with the subtraction circuit of FIG. 6D, the resistance value r of resistors R41 and R43 may be changed. The temperature coefficient associated with the word line voltage decreases with an increase in the resistance value r. However, the temperature coefficient associated with the word line voltage increases with a decrease in the resistance value r.

Figure 10:
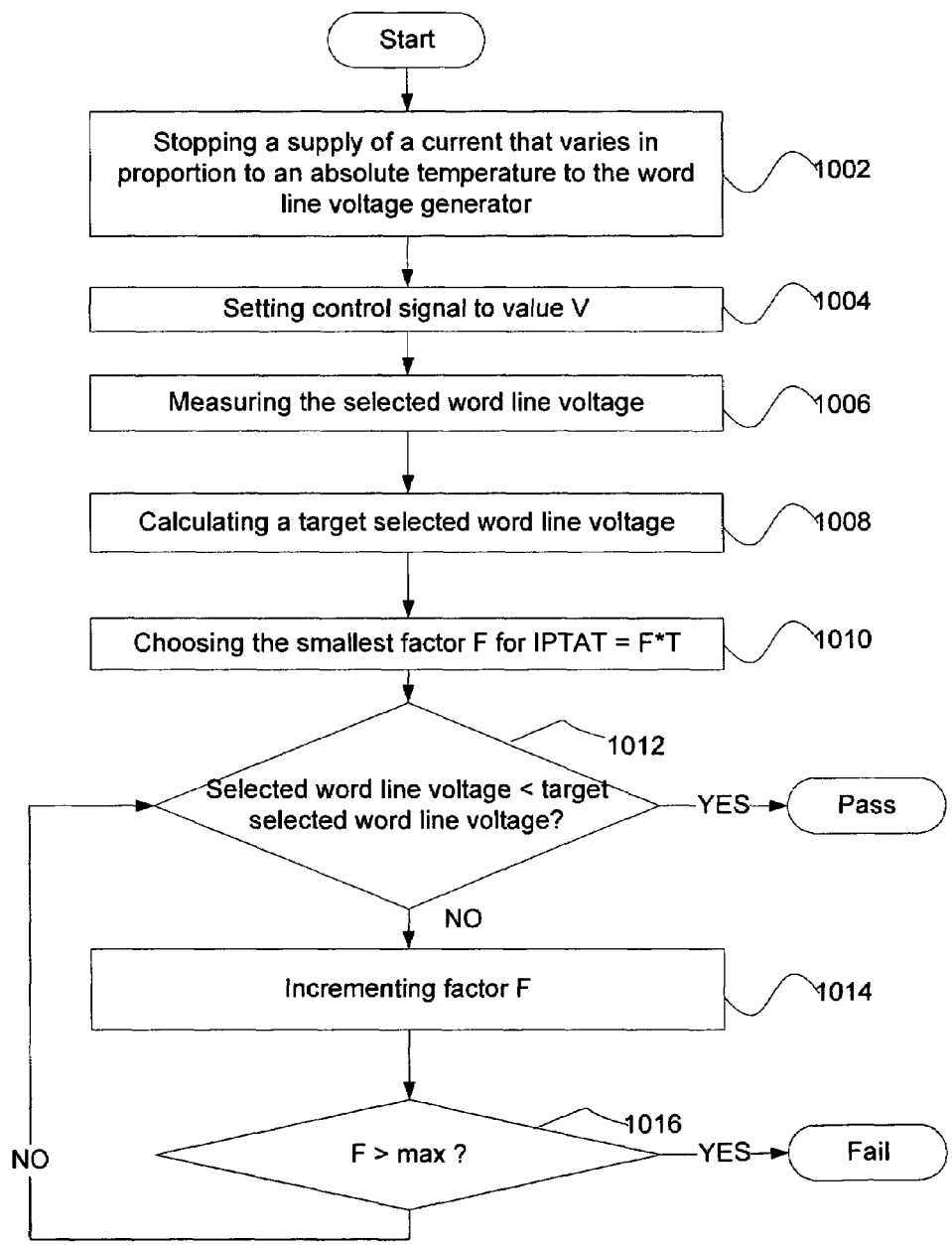
FIG. 10 is a flowchart diagram of further detailed operations for adjusting the selected word line voltage, in accordance with an embodiment.

FIG. 10 is a flowchart diagram of further detailed operations for adjusting the selected word line voltage, in accordance with an embodiment. As shown in FIG. 10, a supply of the current to the word line voltage generator is stopped in operation 1002 to measure the selected word line voltage generated in the absence of a current that varies in proportion to the absolute temperature. The control signal, which is set and supplied to the constant voltage generation circuit by the control logic, is set to a value V in operation 1004. With the flow of current that varies in proportion to the absolute temperature stopped and the control signal set to a value V, the selected word line voltage generated by the word line voltage generator is measured in operation 1006.

With the measured selected word line voltage, a target selected word line voltage can be calculated in operation 1008. The target selected word line voltage is expressed as $$\text{target selected word line voltage} = \text{selected word line voltage} + \text{target temperature coefficient} * \text{absolute temperature} \quad (6.1)$$

where selected word line voltage is the selected word line voltage measured in operation 1006, target temperature coefficient is the temperature coefficient associated with the threshold voltage, and absolute temperature is the temperature in kelvins associated with the selected word line voltage measured in operation 1006. The flow of current that varies in proportion to the absolute temperature expressed as $$IPTAT = F*T \quad (6.2)$$

where T is the absolute temperature and F is a factor associated with the current that varies in proportion to the absolute temperature, such as the variables expressed in Equation (1.2). In operation 1010, in view of Equation (6.2), the supply of current that varies in proportion to the absolute temperature is set to a minimum by choosing the smallest factor F. In other words, the supply of current that varies in proportion to the absolute temperature is changed to a minimum by choosing the smallest factor F. For example, the PTAT circuit can cover a minimum range from about 0 to about −3 mV/K with about 0.1 mV/K steps. As used herein, the term "about" means that the specified dimension or parameter may be varied within an acceptable manufacturing tolerance for a given application. In some embodiments, the acceptable manufacturing tolerance is ±10%. Factor F can be adjusted (i.e., the supply of current that varies in proportion to the absolute temperature can be changed) by using the above-described techniques. For example, in an embodiment, F can be adjusted by changing the characteristic of a circuit element associated with the PTAT circuit.

Thereafter, the supply of current to the word line generator is changed such that the word line generator generates a word line voltage with a temperature coefficient that is substantially equal to the temperature coefficient associated with a threshold voltage. For example, in an embodiment, a comparison between the selected word line voltage and the target selected word line voltage calculated in Equation (6.1) is made in operation 1012. As shown in FIG. 10, if the selected word line voltage is less than the target selected word line voltage, then the temperature coefficient associated with the word line voltage is substantially equal to the temperature coefficient associated with the threshold voltage. Thus, the word line voltage generator can be configured or designed based on factor F.

On the other hand, if the selected word line voltage is greater than the target selected word line voltage, then factor F is incremented in operation 1014. As discussed above, factor F can be incremented by, in an embodiment, changing the characteristic of a circuit element associated with the PTAT circuit. Incrementing factor F increases the supply of current that varies in proportion to the absolute temperature. Since the selected word line voltage is generated by subtracting the voltage that varies in proportion to the absolute temperature from the constant voltage, an increase in the supply of the current that varies in proportion to the absolute temperature decreases the selected word line voltage. Thus, the increment of factor F decreases the selected word line voltage. A check is made in operation 1016 whether the factor F is greater than a maximum value. In an embodiment, the maximum value can be based on the limiting characteristics of one or more circuit elements associated with the PTAT circuit. For example, with reference to Equation (1.2), the PTAT circuit can physically accommodate diodes with a maximum ratio N and/or a resistor with a maximum resistance value R1. If the factor F is greater than the maximum value, then selected word line voltage cannot be adjusted such that the temperature coefficient associated with the selected word line voltage is substantially equal to the temperature coefficient associated with the threshold voltage. If factor F is less than the maximum value, then another comparison between the selected word line voltage and the target selected word line voltage is made in operation 1012. Operations 1012, 1014, and 1016 are repeated until the selected word line voltage is less than the target selected word line voltage or factor F is greater than the maximum value (i.e., the selected word line voltage is substantially equal to the target selected word line voltage).

Figure 11:
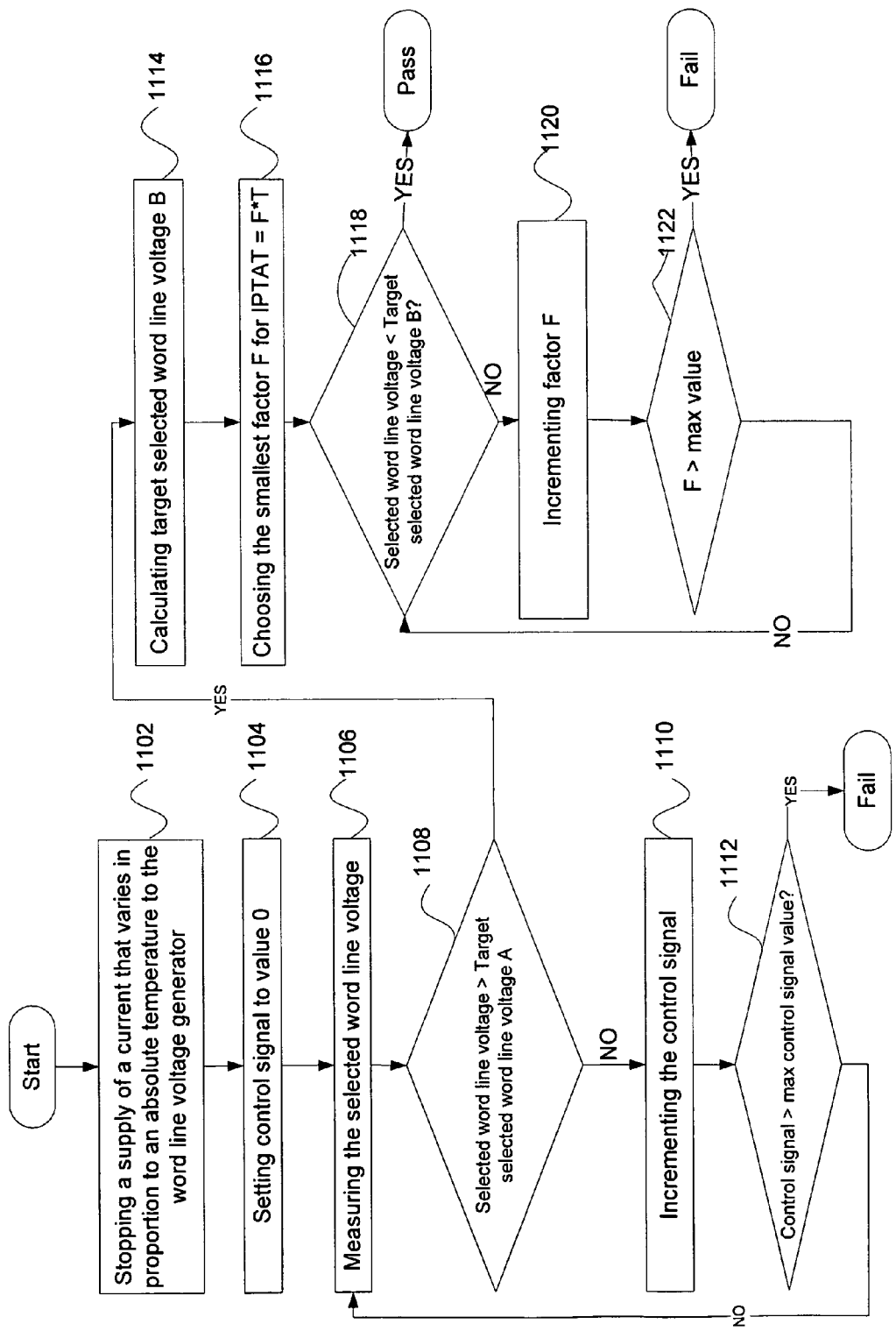
FIG. 11 is a flowchart diagram of still further detailed operations for adjusting the selected word line voltage, in accordance with an embodiment.

FIG. 11 is a flowchart diagram of still further detailed operations for adjusting the selected word line voltage, in accordance with an embodiment. As shown in FIG. 11, to measure the selected word line voltage generated in the absence of a current that varies in proportion to the absolute temperature, a supply of the current to the word line voltage generator is stopped in operation 1102 and the control signal is set to a value of 0 in operation 1104.

With the flow of current that varies in proportion to the absolute temperature stopped and the control signal set to a zero value, the selected word line voltage generated by the word line voltage generator is measured in operation 1106. A comparison is made in operation 1108 between the selected word line voltage and a target selected word line voltage A. The target selected word line voltage A is a selected word line voltage that can be defined or specified by a user. If the selected word line voltage is greater than the target selected word line voltage A, then the target selected word line voltage A is used to calculate target selected word line voltage B in operation 1114. On the other hand, if the selected world line voltage is less than target selected word line voltage A, then the control signal is incremented in operation 1110. A comparison is made in operation 1112 between control signal and a maximum control signal value. Control signal may be limited by the constant voltage that is substantially independent of a temperature change. For example, as shown in FIGS. 6A-6D, constant voltage 314 may range from about 0 V to about voltage VCGHH or from about 0 C to about voltage VCGHH/2. Thus, for example, a voltage VCGHH of about 4 volts can result in a maximum control signal value of about 80.

Returning to FIG. 11, if the control signal is greater than the maximum control signal value, then the target selected word line voltage A as determined by a user is not achieved and the operation fails. However, if the control signal is less than the maximum control signal value, then another measurement of the selected word line voltage is taken in operation 1106. Operations 1106, 1108, 1110, and 1112 are repeated until the selected word line voltage generated by the word line voltage generator is substantially equal to the target selected word line voltage A or until the control signal is greater than maximum control signal value.

With selected word line voltage at target selected word line voltage A, target selected word line voltage B can be calculated in operation 1114. The target selected word line voltage B is expressed as target selected word line voltage $B$=target selected word line voltage $A$+target temperature coefficient*absolute temperature  (6.4)

where target temperature coefficient is the temperature coefficient associated with the threshold voltage and the absolute temperature is the temperature in kelvins associated with the selected word line voltage measured in operation 1106. Thereafter, in view of Equation (6.2), the supply of current that varies in proportion to the absolute temperature is set to a minimum in operation 1116 by choosing the smallest factor F. Factor F can be adjusted (i.e., the supply of current that varies in proportion to the absolute temperature can be changed) by the above-described methods.

Thereafter, the supply of current to the word line generator is changed such that the word line generator generates a word line voltage with a temperature coefficient that is substantially equal to the temperature coefficient associated with a threshold voltage. In an embodiment, a comparison between the selected word line voltage and the target selected word line voltage B calculated in Equation (6.4) is made in operation 1118. As shown in FIG. 11, if the selected word line voltage is less than the target selected word line voltage B, then the temperature coefficient associated with the word line voltage is substantially equal to the temperature coefficient associated with the threshold voltage. Thus, the word line voltage generator can be configured or designed based on factor F.

On the other hand, if the selected word line voltage is greater than the target selected word line voltage B, then factor F is incremented in operation 1120, thereby decreasing the selected word line voltage. A check is made in operation 1122 on whether the factor F is greater than maximum value, which is described above. If the factor F is greater than maximum value, then selected word line voltage cannot be adjusted such that the temperature coefficient associated with the selected word line voltage is substantially equal to the temperature coefficient associated with the threshold voltage. However, if factor F is less than maximum value, then another comparison between the selected word line voltage and the target selected word line voltage B is made in operation 1118. Operations 1118, 1120, and 1122 are repeated until either the selected word line voltage is less than target selected word line voltage B or factor F is greater than the maximum value.

It should be appreciated that the above-described selected word line voltage generation and adjustment can be applied to a variety of memory technologies based on field-effect transistors. Examples of memory technologies include flash memories (e.g., NAND, NOR, Divided bit-line NOR (DINOR), AND, high capacitive coupling ratio (HiCR), asymmetrical contactless transistor (ACT), other flash memories), erasable programmable read-only memory (EPROM), electrically-erasable programmable read-only memory (EEPROM), mask read-only memory (ROM), and other memory technologies.

The above described embodiments provide methods and/or circuitries for generating or adjusting the selected word line voltage. By generating the selected word line voltage based on a difference between a constant voltage that is substantially independent of a temperature change and a voltage that varies in proportion to a temperature, the selected word line voltage can be made to vary with temperature at a rate that is substantially equal to a rate of the threshold voltage. Further, the selected word line voltage can be adjusted such that the selected word line voltage and the threshold voltage vary with temperature at substantially the same rate by changing a characteristic of a circuit element associated with the PTAT circuit and/or the subtraction circuit. Since the reliability of read and verify operations depends on selected word line voltage and threshold voltage distributions, the substantially equal temperature coefficients result in more reliable read and verify operations.

Although the foregoing embodiments have been described in some detail for purposes of clarity of understanding, the embodiments are not limited to the details provided. There are many alternative ways of implementing the embodiments. Accordingly, the disclosed embodiments are to be considered as illustrative and not restrictive, and the embodiments are not to be limited to the details given herein, but may be modified within the scope and equivalents of the appended claims. In the claims, elements and/or operations do not imply any particular order of operation, unless explicitly stated in the claims.

What is claimed is:

1. A word line voltage generator, comprising:
   a constant voltage generation circuit configured to generate a constant voltage that is substantially independent of a temperature change;
   a proportional to absolute temperature circuit configured to generate a current that varies in proportion to an absolute temperature, wherein an absence of the current corresponds to the absolute temperature of absolute zero; and
   a subtraction circuit connected to the constant voltage generation circuit and the proportional to absolute temperature circuit, the subtraction circuit being configured to convert the current to a voltage that varies proportion to the absolute temperature and being configured to generate a selected word line voltage based on a difference between the constant voltage and the voltage that varies in proportion to the absolute temperature.

2. The word line voltage generator of claim 1, wherein the constant voltage generation circuit comprises a voltage multiplier connected to a band-gap reference circuit and a digital-to-analog converter, the band-gap reference circuit being configured to output a reference voltage, the digital-to-analog converter being configured to output a control signal, and the voltage multiplier being configured to generate the constant voltage by magnifying the reference voltage based on the control signal.

3. The word line voltage generator of claim 1, wherein the proportional to absolute temperature circuit comprises:
   a first transistor including a gate, a source, and a drain;
   a second transistor including a gate, a source, and a drain, the drain of the second transistor being connected to the drain of the first transistor and the gate of the second transistor;

a first diode including an anode and a cathode, the anode of the first diode being connected to the source of the second transistor;

a third transistor including a gate, a source, and a drain, the gate of the third transistor being connected to the gate of the first transistor and the drain of the third transistor;

a fourth transistor including a gate, a source, and a drain, the drain of the fourth transistor being connected to the drain of the third transistor and the plurality of gates of the first and third transistors, the gate of the fourth transistor being connected to the gate of the second transistor and the plurality of drains of the first and second transistors;

a resistor including a first end and a second end, the first end of the resistor being connected to the source of the fourth transistor; and a second diode including an anode and a cathode, the anode of the second diode being connected to the second end of the resistor.

4. The word line voltage generator of claim 3, wherein the proportional to absolute temperature circuit further comprises:

a fifth transistor including a gate, a source, and a drain, the gate of the fifth transistor being connected to the plurality of gates of the first and third transistors and the drains of the third and fourth transistors; and a sixth transistor including a gate, a source, and a drain, the drain of the sixth transistor being connected to the drain of the fifth transistor, the gate of the sixth transistor being connected to the plurality of drains of the fifth and sixth transistors.

5. The word line voltage generator of claim 1, wherein the subtraction circuit comprises:

a first transistor including a gate, a source, and a drain;

a first resistor including a first end and a second end, the first end of the first resistor being connected to the drain of the first transistor;

a second resistor including a first end and a second end, the first end of the second resistor being connected to the second end of the first resistor;

a second transistor including a gate, a source, and a drain;

a third resistor including a first end and a second end, the first end of the third resistor being connected to the drain of the second transistor;

a fourth resistor including a first end and a second end, the first end of the fourth resistor being connected to the second end of the third resistor;

a third transistor including a gate, a source, and a drain;

a fifth resistor including a first end and a second end, the first end of the fifth resistor being connected to the drain of the third transistor;

a first operational amplifier including an inverting input, a non-inverting input, and an output, the output of the first operational amplifier being connected to the gate of the first transistor and the gate of the second transistor, the non-inverting input of the first operational amplifier being connected to the first end of the first resistor and the drain of the first transistor; and a second operational amplifier including an inverting input, a non-inverting input, and an output, the inverting input of the second operational amplifier being connected to the drain of the second transistor and the first end of the third resistor, the non-inverting input of the second operational amplifier being connected to the drain of the third transistor and the first end of the fifth resistor.

6. The word line voltage generator of claim 5, further comprising a fourth transistor including a source, a drain, and a gate, the drain of the fourth transistor being connected to the second end of the first resistor and the first end of the second resistor.

7. The word line voltage generator of claim 5, further comprising a fourth transistor including a source, a drain, and a gate, the drain of the fourth transistor being connected to the second end of the third resistor and the first end of the fourth resistor.

8. The word line voltage generator of claim 1, wherein the subtraction circuit comprises:

a first transistor including a source, a drain, and a gate;

a first resistor including a first end and a second end, the first end of the first resistor being connected to the drain of the first transistor;

a second resistor including a first end and a second end, the second end being in connection with the drain of the first transistor and the first end of the first resistor;

a second transistor including a source, a drain, and a gate, the drain of the second transistor being in connection with the first end of the second resistor;

a first operational amplifier including an inverting input, a non-inverting input, and an output, the output of the first operational amplifier being in connection with the gate of the first transistor, the non-inverting input of the first operational amplifier being in connection with the drain of the second transistor and the first end of the second resistor;

a third transistor including a source, a drain, and a gate;

a third resistor including a first end and a second end, the first end of the third resistor being in connection with the drain of the third transistor; and a second operational amplifier including an inverting input, a non-inverting input, and an output, the output of the second operational amplifier being in connection with the gate of the third transistor, the non-inverting input of the second operational amplifier being in connection with the drain of the third transistor and the first end of the third resistor, the inverting input of the second operational amplifier being in connection with the drain of the first transistor, the first end of the first resistor, and the second end of the second resistor.

9. The word line voltage generator of claim 1, wherein the subtraction circuit comprises:

a first transistor including a source, a drain, and a gate;

a first resistor including a first end and a second end, the first end of the first resistor being connected to the drain of the first transistor;

a second resistor including a first end and a second end, the first end of the second resistor being connected to the second end of the first resistor;

a second transistor including a source, a drain, and a gate, the drain of the second transistor being connected to the second end of the first resistor and the first end of the second resistor;

a third transistor including a source, a drain, and a gate;

a third resistor including a first end and a second end, the first end of the third resistor being connected to the drain of the third transistor;

a fourth resistor including a first end and a second end, the first end of the fourth resistor being connected to the second end of the third resistor;

a fourth transistor including a source, a drain, and a gate;

a fifth resistor including a first end and a second end, the first end being connected to the drain of the fourth transistor;

a sixth resistor including a first end and a second end, the first end of the sixth resistor being connected to the second end of the fifth resistor;

a first operational amplifier including an inverting input, a non-inverting input, and an output, the output of the first operational amplifier being connected to the gate of the first transistor and the gate of the third transistor, the non-inverting input of the first operational amplifier being connected to the drain of the first transistor and the first end of the first resistor; and a second operational amplifier including an inverting input, a non-inverting input, and an output, the output of the second operational amplifier being connected to the gate of the fourth transistor, the inverting input of the second operational amplifier being connected to the drain of the third transistor and the first end of the third resistor, the non-inverting input of the second operational amplifier being connected to the second end of the fifth resistor and the first end of the sixth resistor.

10. A memory device, comprising:

a memory array comprising a plurality of memory cells;

a row decoder connected to the memory array, the row decoder being configured to select a word line connected to the plurality of memory cells; and a word line voltage generator configured to generate a selected word line voltage based on a difference between a constant voltage that is substantially independent of a temperature change and a voltage that varies in proportion to an absolute temperature, wherein an absence of the voltage that varies in proportion to the absolute temperature corresponds to the absolute temperature of absolute zero.

11. The memory device of claim 10, further comprising a band gap reference circuit connected to the word line voltage generator, the band gap reference circuit being configured to supply a reference voltage to the word line voltage generator.

12. The memory device of claim 10, wherein the word line voltage generator comprises:

a constant voltage generation circuit configured to generate the constant voltage;

a proportional to absolute temperature circuit configured to generate a current that varies in proportion to the absolute temperature; and a subtraction circuit connected to the constant voltage generation circuit and the proportional to absolute temperature circuit, the subtraction circuit being configured to convert the current to the voltage that varies in proportion to the absolute temperature and being configured to generate the selected word line voltage by subtracting the voltage that varies in proportion to the absolute temperature from the constant voltage.

13. The memory device of claim 10, wherein the plurality of memory cells include a plurality of transistors and wherein a first temperature coefficient of the selected word line voltage is substantially equal to a second temperature coefficient of a threshold voltage associated with the plurality of transistors.

14. A word line voltage generator, comprising:

a constant voltage generation circuit configured to generate a constant voltage that is substantially independent of a temperature change;

a proportional to absolute temperature circuit configured to generate a current that varies in proportion to an absolute temperature, wherein an absence of the current corresponds to the absolute temperature of absolute zero; and a subtraction circuit connected to the constant voltage generation circuit and the proportional to absolute temperature circuit, the subtraction circuit being configured to convert the current to a voltage that varies proportion to the absolute temperature and being configured to generate a selected word line voltage based on a difference between the constant voltage and the voltage that varies in proportion to the absolute temperature, wherein the subtraction circuit comprises, a first transistor including a source, a drain, and a gate, a first resistor including a first end and a second end, the first end of the first resistor being connected to the drain of the first transistor, a second resistor including a first end and a second end, the first end of the second resistor being connected to the second end of the first resistor, a second transistor including a source, a drain, and a gate, the drain of the second transistor being connected to the second end of the first resistor and the first end of the second resistor, a third transistor including a source, a drain, and a gate, a third resistor including a first end and a second end, the first end of the third resistor being connected to the drain of the third transistor, a fourth resistor including a first end and a second end, the first end of the fourth resistor being connected to the second end of the third resistor, a fourth transistor including a source, a drain, and a gate, a fifth resistor including a first end and a second end, the first end being connected to the drain of the fourth transistor, a sixth resistor including a first end and a second end, the first end of the sixth resistor being connected to the second end of the fifth resistor, a first operational amplifier including an inverting input, a non-inverting input, and an output, the output of the first operational amplifier being connected to the gate of the first transistor and the gate of the third transistor, the non-inverting input of the first operational amplifier being connected to the drain of the first transistor and the first end of the first resistor, and a second operational amplifier including an inverting input, a non-inverting input, and an output, the output of the second operational amplifier being connected to the gate of the fourth transistor, the inverting input of the second operational amplifier being connected to the drain of the third transistor and the first end of the third resistor, the non-inverting input of the second operational amplifier being connected to the second end of the fifth resistor and the first end of the sixth resistor.

* * * * *